(12) United States Patent
Kometani et al.

(10) Patent No.: US 8,512,478 B2
(45) Date of Patent: *Aug. 20, 2013

(54) CLEANING AND DRYING-PREVENTING METHOD, AND CLEANING AND DRYING-PREVENTING APPARATUS

(75) Inventors: Yasuyuki Kometani, Koshi (JP); Takeshi Hirao, Koshi (JP); Kentaro Yamamura, Koshi (JP); Kenichi Miyamoto, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/527,904

(22) Filed: Jun. 20, 2012

(65) Prior Publication Data

US 2012/0255581 A1 Oct. 11, 2012

Related U.S. Application Data

(63) Continuation of application No. 12/549,573, filed on Aug. 28, 2009, now Pat. No. 8,216,390.

(30) Foreign Application Priority Data

Sep. 4, 2008 (JP) .................................. 2008-226845

(51) Int. Cl.
*B08B 3/00* (2006.01)

(52) U.S. Cl.
USPC .............. 134/18; 134/22.18; 134/32; 134/36; 134/56 R; 134/57 R; 134/58 R; 134/94.1; 134/133; 134/137; 134/198; 134/21

(58) Field of Classification Search
USPC ............ 134/18, 22.18, 32, 34, 36, 94.1, 133, 134/137, 184, 902, 198; 118/302, 320; 427/421, 427.2; 239/104, 403; 15/302
See application file for complete search history.

(56) References Cited

U.S. PATENT DOCUMENTS

| 6,878,401 B2 | 4/2005 | Nishijima et al. | |
|---|---|---|---|
| 8,216,390 B2 * | 7/2012 | Kometani et al. | 134/36 |

(Continued)

FOREIGN PATENT DOCUMENTS

| JP | 04-094526 A1 | 3/1992 |
|---|---|---|
| JP | 06-260405 A1 | 9/1994 |
| JP | 10-113597 A1 | 5/1998 |
| JP | 2006-302934 A1 | 11/2006 |
| JP | 2007-317706 A1 | 12/2007 |

OTHER PUBLICATIONS

Japanese Office Action dated May 29, 2012 (with English translation).

*Primary Examiner* — Alexander Markoff
(74) *Attorney, Agent, or Firm* — Burr & Brown

(57) ABSTRACT

A cleaning and drying-preventing method including: positioning a nozzle in a container such that a funnel-like inner circumferential surface of the container is located around a periphery of a distal end of the nozzle; sucking a liquid in the nozzle to retract a level of the liquid to a side of a supply passage; supplying a solvent into the container to form a swirl flow of the solvent turning around the distal end of the nozzle, and cleaning the nozzle by the swirl flow; supplying a solvent into the container to form a liquid pool of the solvent; and further retracting the level of the liquid in the nozzle to the side of the supply passage. A liquid layer, an air layer, and a solvent layer are formed in the nozzle in this order from the side of the supply passage, to prevent drying of the liquid in the nozzle.

15 Claims, 12 Drawing Sheets

(56) References Cited

U.S. PATENT DOCUMENTS

2006/0130750 A1 6/2006 Ishikawa et al.
2006/0233952 A1 10/2006 Nakashima et al.
2007/0245953 A1 10/2007 Nakashima et al.
2008/0023034 A1 1/2008 Hirao et al.

* cited by examiner

CLEANING AND DRYING-PREVENTING METHOD, AND CLEANING AND DRYING-PREVENTING APPARATUS

CROSS REFERENCE TO RELATED APPLICATIONS

This application is a continuation of U.S. patent application Ser. No. 12/549,573, filed Aug. 28, 2009, now allowed, and claims the benefit under 35 USC §119(a)-(d) of Japanese Patent Application No. 2008-226845 filed on Sep. 4, 2008, the entireties of which are incorporated herein by reference.

FIELD OF THE INVENTION

The present invention relates to a cleaning and drying-preventing method and a cleaning and drying-preventing apparatus which can clean a process-liquid supply nozzle for supplying a process liquid to a substrate so as to process the substrate, and can prevent drying of a process liquid in the nozzle.

BACKGROUND OF THE INVENTION

In general, when a semiconductor device is manufactured, a photolithographic technique is utilized for forming a circuit pattern. In the photolithographic technique, a circuit pattern is formed on a resist film by coating a resist liquid to a wafer or the like by a spin coating method so as to form a resist film on the wafer or the like, exposing the thus formed resist film in accordance with a predetermined circuit pattern, and developing the resist film.

In such a photolithographic process, there is generally used a coating and developing process system in which an exposure apparatus is connected to a coating and developing apparatus that coats and develops a resist. In the coating and developing process system, a resist liquid is coated to a wafer in the following manner, for example. At first, a resist liquid is discharged from a coating nozzle to the substantially central part of a wafer held by a spin chuck, and then the wafer is rotated. By utilizing the centrifugal force of this rotation, the resist liquid on the surface of the wafer is spread from the center of the wafer W toward a periphery thereof.

The resist liquid, which contains a component of a resist film made of an organic material and a solvent for the component, such as a thinner liquid, tends to be dried when exposed to an atmosphere. When the resist liquid, which has been dried so that a concentration thereof has changed, is coated to a wafer by using a coating nozzle, the coating process may be defective.

There is the following conventional means for preventing drying of a resist liquid in a coating nozzle. At first, a resist liquid is discharged from a coating nozzle to a wafer surface so as to perform a coating process, and thereafter the resist liquid remaining in the coating nozzle is sucked inward the nozzle. Then, the distal end of the coating nozzle is immersed into a solvent stored in a solvent storage part of a standby unit, and the solvent is sucked into the coating nozzle under this state. As a result, in the distal end of the coating nozzle, there are formed a resist liquid part, an air layer outside the resist liquid part, and a solvent for resist liquid part (see, for example, claims and FIG. 8 of JP 2006-302934 A).

As another means for preventing drying of a resist liquid, the following nozzle cleaning apparatus is known. The nozzle cleaning apparatus includes: a cleaning container capable of receiving a nozzle, the cleaning container having a funnel-like inner circumferential surface located around the distal end of a received nozzle, the cleaning container defining therein a cleaning chamber; a cleaning-liquid supply means that supplies to the cleaning container a solvent serving as a cleaning liquid along the funnel-like inner circumferential surface of the cleaning container in the circumferential direction; a fluid conduit through which a solvent discharged from the cleaning container flows, the fluid conduit being disposed below the cleaning container so as to be in communication with the cleaning chamber; and a first solvent storage part disposed on a lower part of the fluid conduit and formed such that a solvent inflowing from the fluid conduit is stored at a liquid level higher than the lower end of the fluid conduit. In the nozzle cleaning apparatus, a solvent stored in the first solvent storage part is evaporated, whereby a solvent atmosphere is formed in the cleaning chamber. As a result, a waiting nozzle is placed in the solvent atmosphere, so that drying and solidification of a resist liquid can be prevented (see, for example, claims and FIG. 2 of JP 2007-317706 A). According to the technique described in JP 2007-317706 A, when the nozzle is received in the cleaning chamber, the cleaning-liquid supply means supplies a predetermined amount of a solvent into the cleaning chamber so as to form a swirl of the solvent turning around the nozzle, whereby the end of the nozzle can be cleaned.

However, in the technique described in JP 2006-302934 A, it is necessary to dispose a solvent storage part on the standby unit, which may enlarge a size of the apparatus. In addition, JP 2006-302934 A does not mention the cleaning of the distal end of the nozzle.

On the other hand, in the technique described in JP 2007-317706 A, when the nozzle is received in the cleaning chamber, the cleaning-liquid supply means supplies a predetermined amount of a solvent into the cleaning chamber. As a result, a swirl of the solvent turning around the nozzle is formed, whereby the distal end of the nozzle can be cleaned. However, in the nozzle cleaning apparatus disclosed in JP 2007-317706 A, since the structure for forming a solvent atmosphere is positioned below the cleaning chamber, a size of the apparatus has to be enlarged. In addition, since the nozzle is placed in a solvent atmosphere so as to prevent drying of a resist liquid, a larger amount of solvent may be required as compared with that of the technique described in JP 2006-302934 A.

SUMMARY OF THE INVENTION

The present invention has been made in view of the above circumstances. The object of the present invention is to provide a cleaning and drying-preventing method, and a cleaning and drying-preventing apparatus, which can clean a nozzle used for a liquid process and can prevent drying of a process liquid in the nozzle, while avoiding enlargement in size of the apparatus.

A cleaning and drying-preventing method in one aspect of the present invention is a cleaning and drying-preventing method for cleaning a process-liquid supply nozzle configured to supply a process liquid to a substrate so as to process the substrate, and for preventing drying of the process liquid in the nozzle, the cleaning and drying-preventing method comprising:

receiving the nozzle in a container having a funnel-like inner circumferential surface and defining therein a cleaning chamber, such that the inner circumferential surface is located around a distal end of the nozzle;

sucking the process liquid remaining in the nozzle so as to retract a liquid level of the process liquid in the nozzle to a side of a process-liquid supply passage;

supplying a first solvent for the process liquid from a first solvent supply unit into the cleaning chamber along the funnel-like inner circumferential surface in a circumferential direction of the inner circumferential surface so as to form a swirl flow of the first solvent turning around the distal end of the nozzle, and cleaning the nozzle by the swirl flow;

supplying a second solvent for the process liquid from a second solvent supply unit to a region positioned above the funnel-like inner circumferential surface in the cleaning chamber so as to form a liquid pool of a solvent in the cleaning chamber; and further sucking the process liquid remaining in the nozzle so as to further retract the liquid level of the process liquid in the nozzle to the side of the process-liquid supply passage, and sucking the solvent in the liquid pool into the nozzle so as to form, in the nozzle, a process liquid layer, an air layer, and a solvent layer in this order from the side of the process-liquid supply passage.

According to such a cleaning and drying-preventing method, the cleaning efficiency of the nozzle can be improved, and drying of the process liquid in the nozzle can be more reliably prevented, while avoiding enlargement in size of the apparatus.

The cleaning and drying-preventing method in this aspect of the present invention may further comprise: discharging the process liquid from the nozzle, before the process liquid remaining in the nozzle is sucked so as to retract the liquid level of the process liquid in the nozzle to the side of the process-liquid supply passage. According to such a cleaning and drying-preventing method, after the process liquid remaining in the nozzle has been discharged, an air layer can be formed in the nozzle. Thus, the air layer can be formed without sucking any droplets of the process liquid into the nozzle.

In addition, the cleaning and drying-preventing method in this aspect of the present invention may further comprise retracting a liquid level of the solvent forming the solvent layer in the nozzle to the side of the process-liquid supply passage, after there have been formed, in the nozzle, the process liquid layer, the air layer, and the solvent layer in this order from the side of the process-liquid supply passage. According to such a cleaning and drying-preventing method, since the air layer can be formed without sucking any droplets of the solvent into the nozzle, the solvent can be prevented from being discharged to a substrate in a succeeding process.

Further, in the cleaning and drying-preventing method in this aspect of the present invention, the second solvent may be supplied from the second solvent supply unit into the cleaning chamber along an inner circumferential surface of the container in a circumferential direction of the inner circumferential surface. According to such a cleaning and drying-preventing method, a swirl flow can be stably formed in the cleaning chamber, whereby a cleaning efficiency of the nozzle can be stably improved.

Further, in the cleaning and drying-preventing method in this aspect of the present invention, the second solvent may be supplied from the second solvent supply unit into the cleaning chamber along an inner circumferential surface of the container in a circumferential direction of the inner circumferential surface; and the circumferential direction in which the first solvent is supplied from the first solvent supply unit and the circumferential direction in which the second solvent is supplied from the second solvent supply unit may be opposite to each other. According to such a cleaning and drying-preventing method, a flow velocity of the second solvent tends to be decelerated, so that a liquid pool of the solvent can be easily formed in the cleaning chamber. Thus, drying of the process liquid in the nozzle can be more reliably prevented.

Further, in the cleaning and drying-preventing method in this aspect of the present invention, an amount per unit time at which the second solvent is supplied from the second solvent supply unit may be not less than an amount per unit time at which the first solvent is supplied from the first solvent supply unit. According to such a cleaning and drying-preventing method, since a liquid pool of the solvent can be easily formed in the cleaning chamber, drying of the process liquid in the nozzle can be more reliably prevented.

Further, in the cleaning and drying-preventing method in this aspect of the present invention, the first solvent supplied from the first solvent supply unit and the second solvent supplied from the second solvent supply unit may be solvents of the same type. According to such a cleaning and drying-preventing method, since the first solvent supply unit and the second solvent supply unit can be connected to the same solvent supply source, a size of the apparatus can be reduced. Alternatively, in the cleaning and drying-preventing method in this aspect of the present invention, the first solvent supplied from the first solvent supply unit and the second solvent supplied from the second solvent supply unit may be solvents of different types.

Further, in the cleaning and drying-preventing method in this aspect of the present invention, a volatility of the second solvent supplied from the second solvent supply unit may be lower than a volatility of the first solvent supplied from the first solvent supply unit. For concrete example, the first solvent which may be mainly used for cleaning the nozzle may be a thinner liquid, and the second solvent which may be mainly used for preventing drying of the resist liquid may be a solvent having a volatility lower than that of a thinner, such as cyclohexanone, propylene glycol methyl ether acetate (PGMEA), methyl amyl ketone (MAK), etc. According to such a cleaning and drying-preventing method, since volatilization of the solvent of the solvent layer formed in the nozzle in order to prevent drying of the process liquid can be delayed, drying of the process liquid in the nozzle can be restrained.

Further, in the cleaning and drying-preventing method in this aspect of the present invention, the nozzle is moved upward and downward, while the nozzle may be being cleaned by the swirl flow of the first solvent. According to such a cleaning and drying-preventing method, since a surface area of the region of the nozzle to be cleaned can be increased, a cleaning efficiency of the nozzle can be further improved.

A cleaning and drying-preventing apparatus in one aspect of the preset invention is a cleaning and drying-preventing apparatus for cleaning a process-liquid supply nozzle configured to supply a process liquid to a substrate so as to process the substrate, and for preventing drying of the process liquid in the nozzle, the cleaning and drying-preventing apparatus comprising:

a container configured to be capable of receiving the nozzle, the container having a funnel-like inner circumferential surface to be located around a distal end of the received nozzle, and defining therein a cleaning chamber;

a first solvent supply unit connected to the container, the first solvent supply unit being configured to supply a first solvent for the process liquid into the cleaning chamber along the funnel-like inner circumferential surface in a circumferential direction of the inner circumferential surface;

a second solvent supply unit connected to the container, the second solvent supply unit being configured to supply a second solvent for the process liquid to a region positioned above the funnel-like inner circumferential surface in the cleaning chamber;

a suction mechanism configured to suck a liquid in the nozzle to a side of a process-liquid supply passage communicated with the nozzle so as to supply the process liquid to the nozzle;

a nozzle movement mechanism configured to move the nozzle between a position inside the container and a position at which a process liquid is discharged to the substrate; and a control device configured to control the first solvent supply unit, the second solvent supply unit, the suction mechanism, and the nozzle movement mechanism;

wherein the control device is configured to control the first solvent supply unit, the second solvent supply unit, the suction mechanism, and the nozzle movement mechanism such that:

when the nozzle is received in the container, a liquid level of the process liquid in the nozzle is retracted to the side of the process-liquid supply passage by means of a sucking action performed by the suction mechanism;

then, the first solvent is supplied from the first solvent supply unit into the cleaning chamber so as to form a swirl flow of the first solvent turning around the distal end of the nozzle, so that the nozzle is cleaned by the swirl flow;

then, the second solvent is supplied from the second solvent supply unit into the cleaning chamber so as to form a liquid pool of a solvent in the cleaning chamber; and then, there are formed, in the nozzle, a process liquid layer, an air layer, and a solvent layer in this order from the side of the process-liquid supply passage, by means of a sucking action performed by the suction mechanism.

According to such a cleaning and drying-preventing apparatus, the cleaning efficiency of the nozzle can be improved, and drying of the process liquid in the nozzle can be more reliably prevented, while avoiding enlargement in size of the apparatus.

In the cleaning and drying-preventing apparatus in this aspect of the present invention, the control device is configured to discharge the process liquid from the nozzle, before the liquid level of the process liquid in the nozzle may be retracted to the side of the process-liquid supply passage by means of the sucking action performed by the suction mechanism. According to such a cleaning and drying-preventing apparatus, after the process liquid remaining in the nozzle has been discharged, an air layer can be formed in the nozzle. Thus, the air layer can be formed without sucking any droplets of the process liquid into the nozzle.

In addition, in the cleaning and drying-preventing apparatus in this aspect of the present invention, the control device may be configured to retract a liquid level of the solvent forming the solvent layer in the nozzle to the side of the process-liquid supply passage, after there have been formed, in the nozzle, the process liquid layer, the air layer, and the solvent layer in this order from the side of the process-liquid supply passage. According to such a cleaning and drying-preventing apparatus, since the air layer can be formed without sucking any droplets of the solvent into the nozzle, the solvent can be prevented from being discharged to a substrate in a succeeding process.

Further, in the cleaning and drying-preventing apparatus in this aspect of the present invention, the first solvent supply unit may include a first solvent supply passage extended so as to be tangent to the funnel-like inner circumferential surface and communicated with the container.

Further, in the cleaning and drying-preventing apparatus in this aspect of the present invention, the first solvent supply unit may include a first solvent supply passage extended so as to be tangent to the funnel-like inner circumferential surface and communicated with to the container, the second solvent supply unit may include a second solvent supply passage extended so as to be tangent to an inner circumferential surface of the container, which is positioned above the funnel-like inner circumferential surface, and communicated with the container, and the first solvent from the first solvent supply passage and the second solvent from the second solvent supply passage may be discharged into the cleaning chamber in the same direction. According to such a cleaning and drying-preventing apparatus, a swirl flow can be stably formed in the cleaning chamber, whereby a cleaning efficiency of the nozzle can be stably improved.

Further, in the cleaning and drying-preventing apparatus in this aspect of the present invention, the first solvent supply unit may include a first solvent supply passage extended so as to be tangent to the funnel-like inner circumferential surface and communicated with the container, the second solvent supply unit may include a second solvent supply passage extended so as to be tangent to an inner circumferential surface of the container, which is positioned above the funnel-like inner circumferential surface, and communicated with the container, and the first solvent from the first solvent supply passage and the second solvent from the second solvent supply passage may be discharged into the cleaning chamber in directions opposite to each other. According to such a cleaning and drying-preventing apparatus, a flow velocity of the second solvent tends to be decelerated, so that a liquid pool of the solvent can be easily formed in the cleaning chamber. Thus, drying of the process liquid in the nozzle can be more reliably prevented.

Further, in the cleaning and drying-preventing apparatus in this aspect of the present invention, an amount per unit time at which the second solvent may be supplied from the second solvent supply unit is not less than an amount per unit time at which the first solvent is supplied from the first solvent supply unit. According to such a cleaning and drying-preventing apparatus, since a liquid pool of the solvent can be easily formed in the cleaning chamber, drying of the process liquid in the nozzle can be more reliably prevented.

Further, in the cleaning and drying-preventing apparatus in this aspect of the present invention, the first solvent supplied from the first solvent supply unit and the second solvent supplied from the second solvent supply unit may be solvents of the same type. According to such a cleaning and drying-preventing apparatus, since the first solvent supply unit and the second solvent supply unit can be connected to the same solvent supply source, a size of the apparatus can be reduced.

Further, in the cleaning and drying-preventing apparatus in this aspect of the present invention, a volatility of the second solvent supplied from the second solvent supply unit may be lower than a volatility of the first solvent supplied from the first solvent supply unit. According to such a cleaning and drying-preventing apparatus, since volatilization of the solvent of the solvent layer formed in the nozzle in order to prevent drying of the process liquid can be delayed, drying of the process liquid in the nozzle can be restrained.

Further, in the cleaning and drying-preventing apparatus in this aspect of the present invention, the control device may be configured to move the nozzle upward and downward by the nozzle movement mechanism, while the nozzle is being cleaned by the swirl flow of the first solvent. According to such a cleaning and drying-preventing apparatus, since a surface area of the region of the nozzle to be cleaned can be increased, a cleaning efficiency of the nozzle can be further improved.

A storage medium in one aspect of the present invention is a storage medium storing a program executed by a control device for controlling a cleaning and drying-preventing apparatus, wherein, upon execution by the control device, the program causes the cleaning and drying-preventing apparatus to perform one of the aforementioned cleaning and drying-preventing methods.

DETAILED DESCRIPTION OF THE INVENTION

An embodiment of the present invention will be described below with reference to the accompanying drawings. In the following embodiment, there is described an example in which a liquid processing apparatus including a cleaning and drying-preventing apparatus 60 of the present invention is applied to a coating apparatus configured to perform a coating process of a resist liquid.

Figure 1:
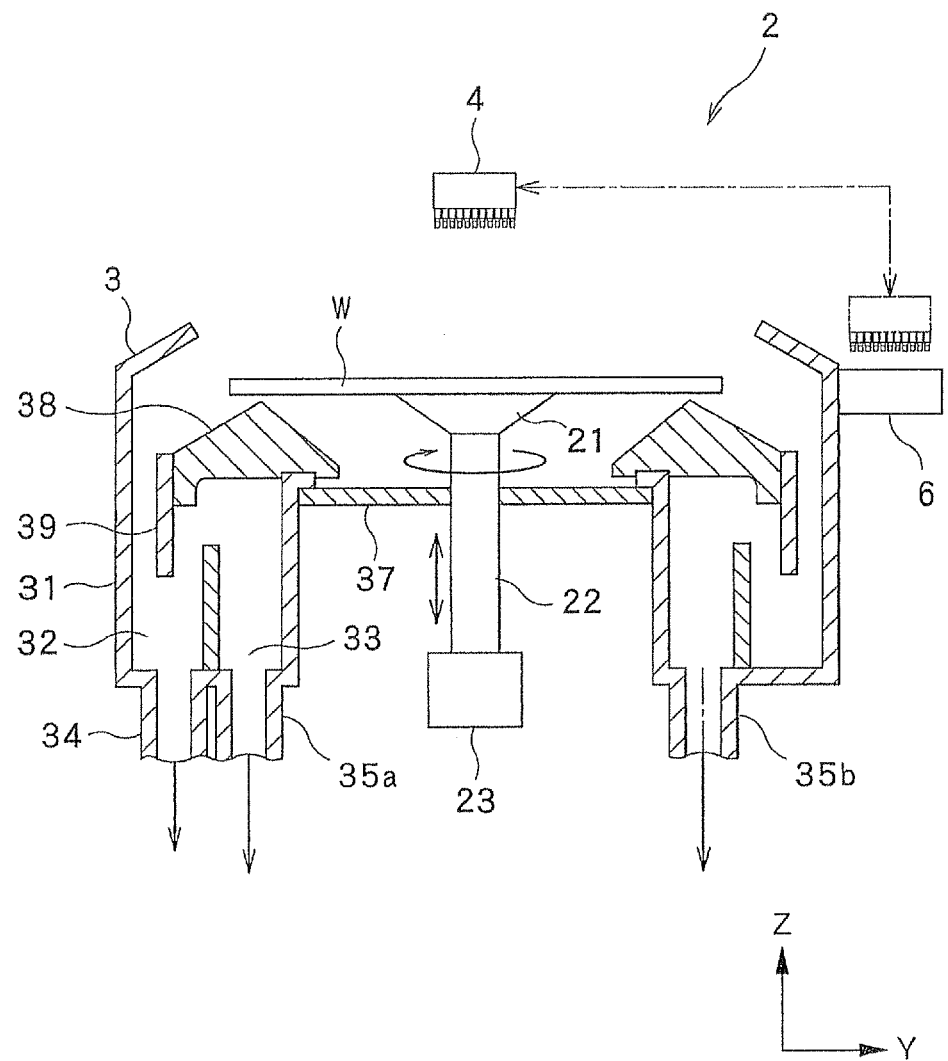
FIG. 1, which is a view for explaining one embodiment of the present invention, is a schematic sectional view showing an example of a coating apparatus provided with a cleaning and drying-preventing apparatus.
Figure 2:
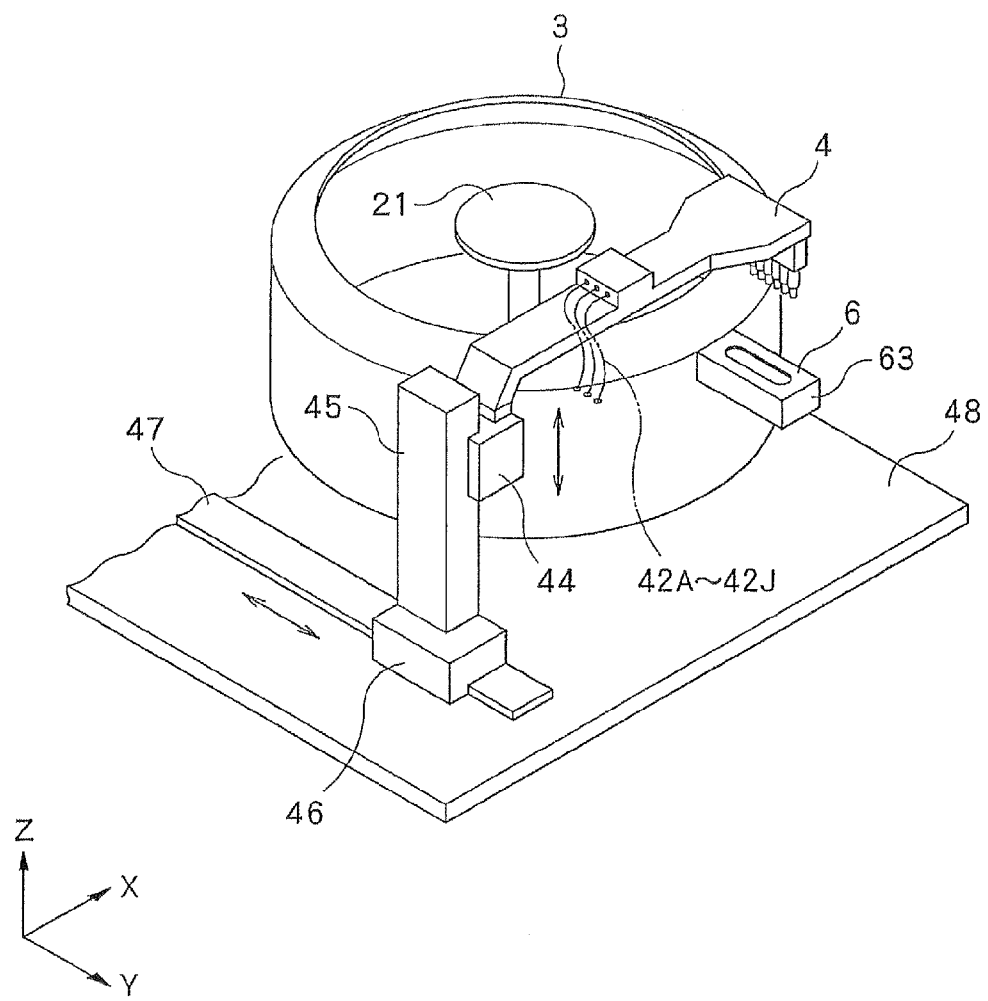
FIG. 2 is a schematic perspective view showing the coating apparatus shown in FIG. 1.

FIG. 1 is a longitudinal sectional view schematically showing an example of the coating apparatus, and FIG. 2 is a perspective view schematically showing the coating apparatus.

Figure 3:
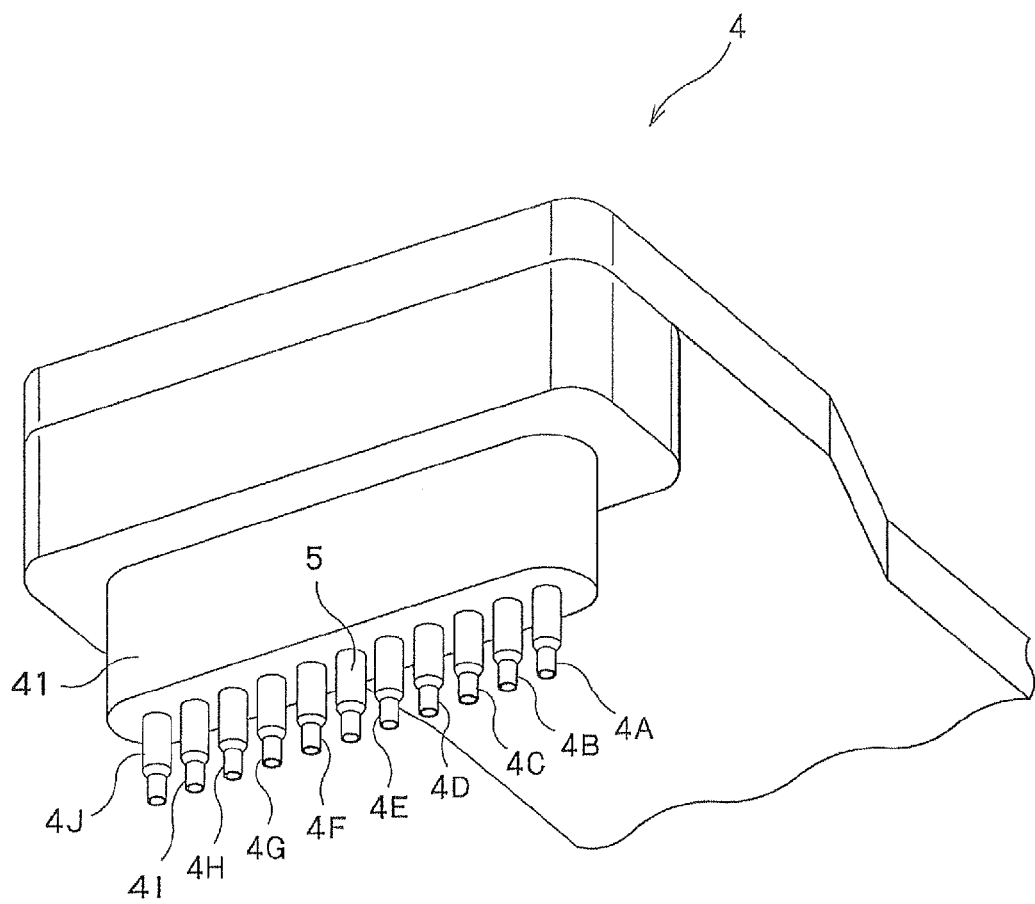
FIG. 3 is a perspective view showing a nozzle unit in one embodiment.

The coating apparatus 2 includes a spin chuck 21 serving as a substrate holder configured to suck a central part of a rear surface of a semiconductor wafer (hereinafter referred to as "wafer") W as a substrate so as to horizontally holding the wafer W, and a nozzle unit 4. The nozzle unit 4 has a plurality of, e.g., ten process-liquid supply nozzles 4A to 4J (see FIG. 3) configured to discharge (supply) a resist liquid as a process liquid to a wafer W held by the spin chuck 21, and one solvent supply nozzle 5 (hereinafter referred to as "thinner nozzle 5") configured to discharge (supply) a solvent for the resist liquid, such as a thinner liquid, to the wafer W.

The spin chuck 21 is connected to a driving mechanism (spin-chuck motor) 23 through a shaft part 22. The spin chuck 21 is held by the driving mechanism 23 such that the spin chuck 21 can be rotated as well as elevated and lowered.

Outside a periphery of the wafer W held by the spin chuck 21, a cup body 3 is disposed so as to surround the wafer W, the cup body 3 having an upper opening. An upper end part of a peripheral surface of the cup body 3 is inclined inward. A recessed liquid receiving part 31 is circumferentially disposed on a lower part of the cup body 3 such that the liquid receiving part 31 is positioned below the periphery of the wafer W. The liquid receiving part 31 is separated into an outside area 32 and an inside area 33. Connected to a bottom part of the outside area 32 is a drain pipe 34 through which a collected process liquid or the like is drained. In addition, connected to a bottom part of the inside area 33 are two exhaust pipes 35*a* and 35*b*.

A circular plate 37 is disposed below the wafer W. A ring member 38 having a triangular section with a raised central part is disposed so as to surround the circular plate 37 from outside. A cylindrical wall 39 extending downward is disposed on an outer end surface of the ring member 38. The cylindrical wall 39 is extended into the outside area 32. A process liquid or the like supplied onto the wafer W is to be guided into the outside area 32 along surfaces of the ring member 38 and the cylindrical wall 39. Although not shown, there is disposed an elevation pin passing through the circular plate 37, the pin being capable of being elevated and lowered while supporting the wafer W from a rear surface thereof. By a cooperation of the elevation pin and a main transfer means which will be described below, a wafer W can be transferred to and from the spin chuck 21.

As shown in FIGS. 2 to 5A, the nozzle unit 4 includes the plurality of, e.g., ten process-liquid supply nozzles 4A to 4J configured to supply a process liquid such as a resist liquid to a wafer W, and the single solvent supply nozzle 5 configured to supply a solvent for the process liquid, such as a thinner liquid, to the wafer W. In addition, the nozzle unit 4 has a support part 41 for supporting the process-liquid supply nozzles 4A to 4J and the solvent supply nozzle 5. The process-liquid supply nozzles 4A to 4J and the solvent supply nozzle 5 are integrally secured to the common support part 41. The support part 41 is provided with a temperature adjusting mechanism, not shown.

As shown in FIGS. 3 to 5A, for example, the process-liquid supply nozzles 4A to 4J and the solvent supply nozzle 5 are aligned along a length direction of the coating apparatus 2 (along a Y-axis direction), and are supported by the support part 41. In the example shown in FIGS. 3 to 5A, the solvent supply nozzle 5 is located on a mid position, and the five process-liquid supply nozzles 4A to 4E and the five process-liquid supply nozzles 4F to 4J are located on opposite sides of the solvent supply nozzle 5.

Figure 4:
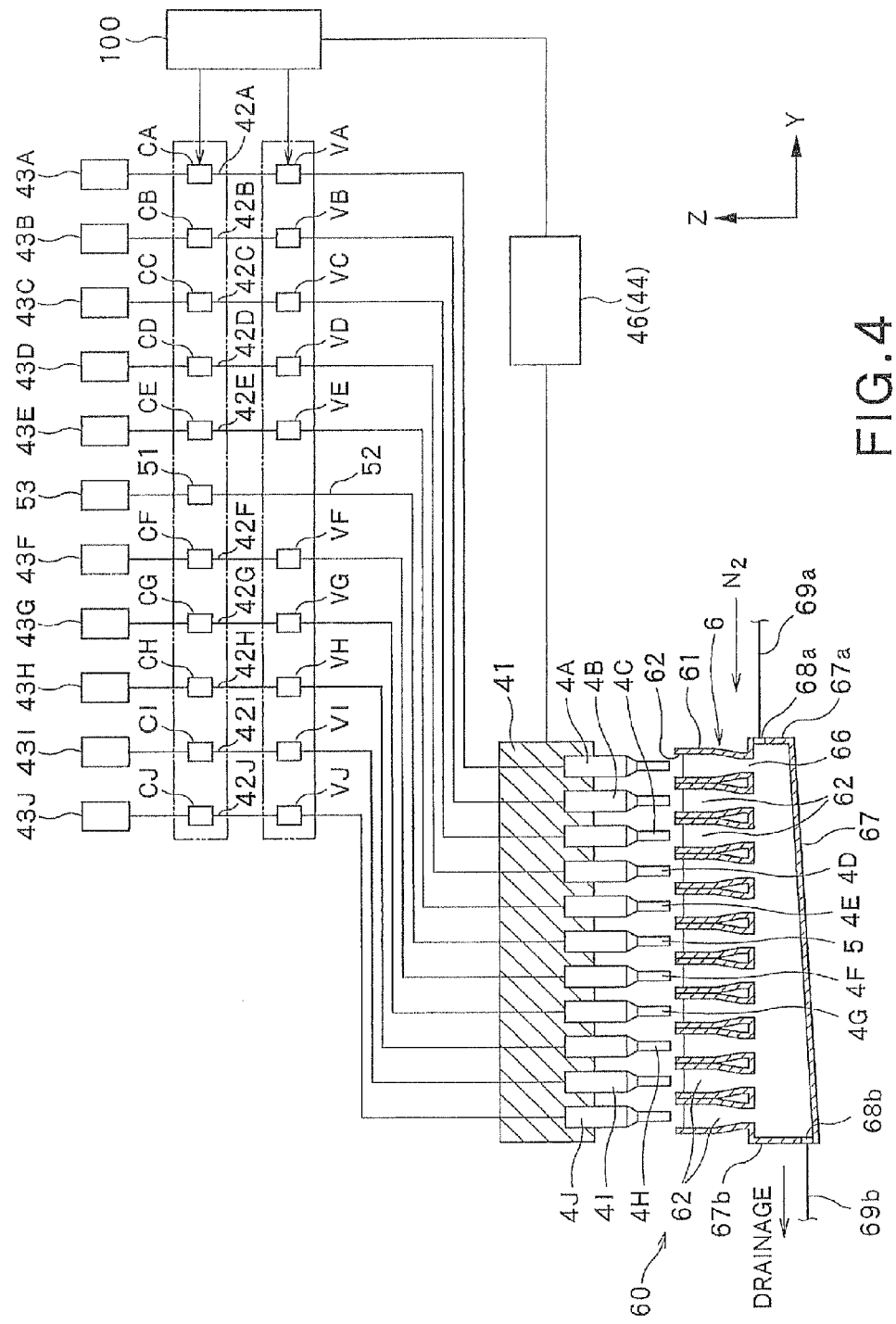
FIG. 4 is a front sectional view showing the nozzle unit shown in FIG. 3.

As shown in FIG. 4, the respective process-liquid supply nozzles 4A to 4J are connected to different process-liquid supply sources 43A to 43J through discrete process-liquid supply passages 42A to 42J. On the process-liquid supply passages 42A to 42J, suck back valves VA to VJ and flow-rate adjusting parts CA to CJ each including an opening and closing valve, a mass flow controller, and so on are provided. The process-liquid supply passages 42A to 42J and a plurality of, e.g., two nozzle-temperature adjusting passages (not shown) for supplying a fluid whose temperature has been adjusted by the temperature adjusting mechanism, are made by using a flexible material so as not to interfere with a movement of the nozzle unit 4 when the nozzle unit 4 is moved, which is described below. The process-liquid supply passages 42A to 42J and the nozzle-temperature adjusting passages are extended into an area below the below-described base plate 48, under the state in which, as shown by the chain lines in FIG. 2, for example, the process-liquid supply passages 42A to 42J and the nozzle-temperature adjusting pipes are pulled together. For example, on the downside of the base plate 48, the suck back valves VA to JF, the flow-rate adjusting parts CA to CJ, the process-liquid supply sources 43A to 43J, a pump, a filter, and the like are disposed on the process-liquid supply passages 42A to 42J and the nozzle-temperature adjusting passages.

The suck back valves VA to VJ constitute suction mechanisms, and are capable of sucking a liquid remaining in the nozzles to the side of the process-liquid supply passages. On the other hand, the flow-rate adjusting parts CA to CJ constitute means for adjusting a flow rate of a process liquid. The process-liquid supply sources 43A to 43J respectively store resist liquids of different types, or a resist liquid of the same type but having different viscosities. For example, an I-Line resist liquid, a KrF resist liquid, and an ArF resist liquid are stored as a process liquid in the process-liquid supply sources 43A to 43J.

The solvent supply nozzle 5 is connected to a solvent supply source 53 through a solvent supply passage 52. The solvent supply passage 52 is provided with a flow-rate adjusting part 51 including an opening and closing valve, a mass flow controller, and so on.

When a discharge of a process liquid from the process-liquid supply nozzles 4A to 4J is stopped, the suck back valves VA to JV corresponding thereto function such that liquid levels of the distal ends of the process liquid remaining in the process-liquid supply nozzles 4A to 4J are retracted (sucked back) to the side of the process-liquid supply passages 42A to 42J. For example, the suck back valves VA to VJ respectively have bellows in which suction chambers in communication with the process-liquid supply passages 42A to 42J are formed. By expanding the bellows so as to generate a negative pressure in the suction chambers, the process liquid in the process-liquid supply nozzles 4A to 4J can be retracted to the side of the process-liquid supply passages 42A to 42J. Further, the suck back valves VA to VJ are equipped with needles. By varying a maximum volume of the suction chamber by means of the needle, a distance at which the distal-end liquid level of the process liquid is retracted can be adjusted. Operations of the suck back valves VA to VJ are controlled by the below-described controller 100 as a control device.

Figure 6A:
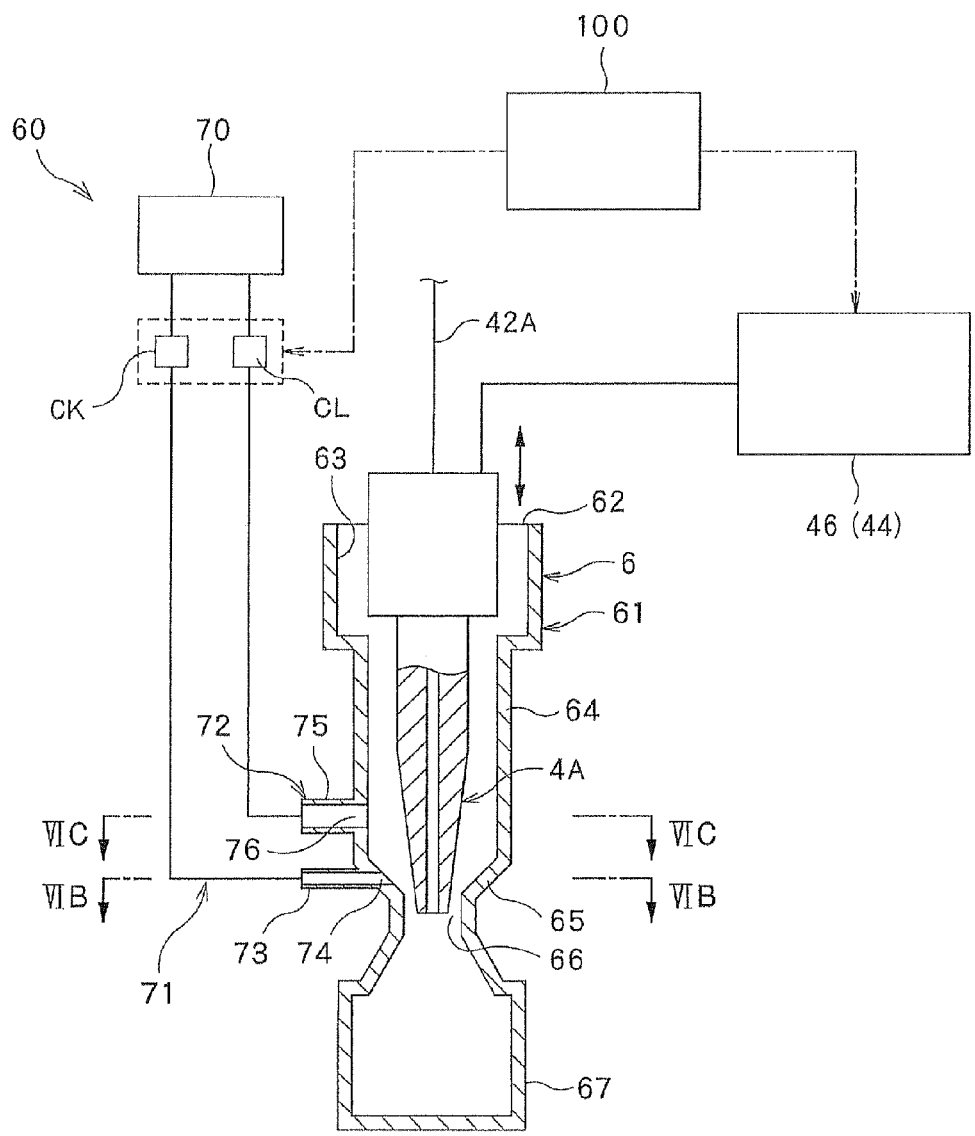
FIG. 6A is a longitudinal sectional view showing the cleaning and drying-preventing apparatus.

A standby unit 6 of the nozzle unit 4 is disposed on, for example, an outer surface of the cup 3. In the standby unit 6, eleven containers 61 each defining a cleaning chamber 62 are aligned in the Y-axis direction, the containers 61 being capable of receiving the respective process-liquid supply nozzles 4A to 4J and the solvent supply nozzle 5. Herein, the container 61 for receiving the process-liquid supply nozzle 4A is described as a representative example. As shown in FIGS. 4 and 6A, the container 61 is structured such that the container 61 can receive the process-liquid supply nozzle 4A (hereinafter referred to as "nozzle 4A"). The container 61 defines therein the cleaning chamber 62. The container 61 has a funnel-like inner circumferential surface located around the periphery of the distal end of the nozzle 4A that is received in the container 61. The container 61 includes: an enlarged opening recess 63 for receiving the nozzle 4A and the support part 41; a cylindrical drum part 64 connected to a lower end of the enlarged opening recess 63; and a funnel part 65 connected to a lower end of the cylindrical drum part 64, the funnel part 65 being tapered downward. The total length of the cylindrical drum part and the funnel part 65 is between about 25 mm and 30 mm.

A liquid discharge chamber 67 is disposed on a lower end of the funnel part 65 of the cleaning chamber 62 through a communication path 66. A cleaning liquid such as a thinner liquid can be collected in the liquid discharge chamber 67. As shown in FIG. 4, a bottom surface of the liquid discharge chamber 67 is inclined in the Y direction. An $N_2$ gas supply pipe 69a connected to an $N_2$ gas supply source (not shown), for example, is connected to a supply opening 68a disposed in one sidewall 67a that is continuous to the higher bottom surface. On the other hand, a drain pipe 69b is connected to a liquid discharge opening 68b disposed in a lower end part of the other sidewall 67b that is continuous to the lower bottom surface.

Connected to the funnel part 65 of the container 61 is a first solvent supply unit 71 configured to supply a solvent for resist liquid, such as a thinner liquid, along the inner circumferential surface of the funnel part 65 of the container 61. In addition, a second solvent supply unit 72 configured to supply a solvent for resist liquid, such as a thinner liquid, is connected to a lower region of the cylindrical drum part 64 positioned above the funnel part 65 of the container 61.

Figure 6B:
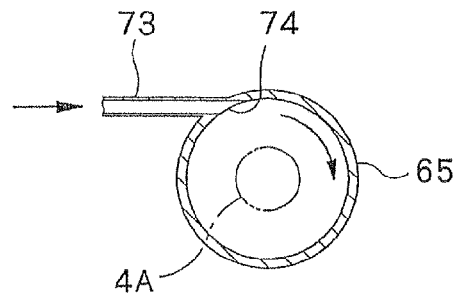
FIG. 6B is a sectional view taken along the line VIB-VIB of FIG. 6A.
Figure 6C:
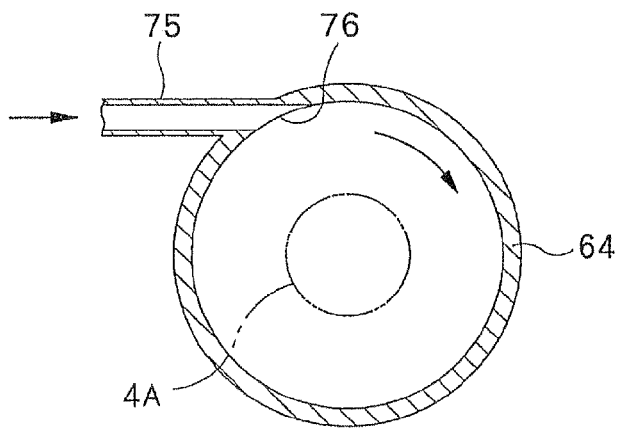
FIG. 6C is a sectional view taken along the line VIC-VIC of FIG. 6A.

The first solvent supply unit 71 has a first solvent supply passage 73 communicated with a solvent supply source 70. The first solvent supply passage 73 is communicated with the inside of the cleaning chamber 62 via a first inlet 74 disposed in the funnel part 65 of the container 61. As shown in FIG. 6B, the first solvent supply passage 73 is extended so as to be tangent to the funnel-like inner circumferential surface and is connected to the funnel part 65 of the container 61. The second solvent supply unit 72 has a second solvent supply passage 75 communicated with the solvent supply source 70. The second solvent supply passage 72 is communicated with the inside of the cleaning chamber 62 via a second inlet 76 disposed in the cylindrical drum part 64 of the container 61. As shown in FIG. 6C, the second solvent supply passage 75 is extended so as to be tangent to the inner circumferential surface of the cylindrical drum part 64 and is connected to the cylindrical drum part 64 of the container 61. In this example, the direction in which the first solvent supply passage 73 is extended so as to be connected toward the container 61 and the direction in which the second solvent supply passage 75 is extended so as to be connected toward the container 61 are the same. Namely, the first inlet 74 and the second inlet 76 are extended in the same direction toward the container. On the first solvent supply passage 73 and the second solvent supply passage 75, respectively, flow-rate adjusting parts CK and CL each including an opening and closing valve, a mass flow controller, and so on are provided. Operations of the flow-rate adjusting parts CK and CL are controlled by the below-described controller 100 as a control device. For example, under the control of the controller 100, a flow rate of a thinner liquid that is a solvent supplied (flown) from the second solvent supply unit 72 into the cleaning chamber 62 is set to be equal to or larger than a flow rate of a thinner liquid that is a solvent supplied (flown) from the first solvent supply unit 71 into the cleaning chamber 62.

Under the state in which the nozzle 4A is received in the container 61 as structured above, a liquid level of a resist liquid in the nozzle 4A can be retracted to the side of the process-liquid supply passage by the suck back valve VA serving as a suction mechanism. When a thinner liquid as a first solvent is supplied (flown) from the first solvent supply unit 71 into the cleaning chamber 62, the thinner liquid flows along the inner circumferential surface of the funnel part 65. At this time, the thinner liquid forms a swirl flow turning around the distal end of the nozzle 4A, so that the resist liquid adhering to the distal end of the nozzle 4A can be removed. Then, a thinner liquid as a second solvent is supplied (flown) from the second solvent supply unit 72 into the cleaning chamber 62, the thinner liquid flows along the inner circumferential surface of the cylindrical drum part 64 that is positioned above the funnel part 65, and forms a liquid pool of the thinner liquid in the funnel part 65 and nearby the lower end part of the cylindrical drum part 64 of the cleaning chamber 62. Under this state, i.e., under the state in which the second solvent is being supplied from the second solvent supply unit 72 into the cleaning chamber 62 so that the liquid pool of the solvent is formed in the lower region in the cleaning chamber, the liquid in the nozzle 4A is sucked by the suck back valve VA. Then, in the distal end region in the nozzle 4A, there are formed a resist liquid layer (process liquid layer), an air layer, and a solvent layer made of the solvent for the resist liquid, i.e., a thinner liquid layer, in this order from the side of the process-liquid supply passage 42A. Thus, the resist liquid in the distal end region in the nozzle 4A is blocked against an atmosphere by the air layer and the thinner liquid layer, whereby drying of the resist liquid in the nozzle can be prevented.

The thinner liquid supplied into the cleaning chamber 62 flows into the liquid discharge chamber 67 through the communication path 66. Then, the thinner liquid is discharged from the liquid discharge chamber 67 to the outside, through the drain pipe 69b via the liquid discharge opening 68b disposed in the bottom part of the container 61.

Figure 7A:
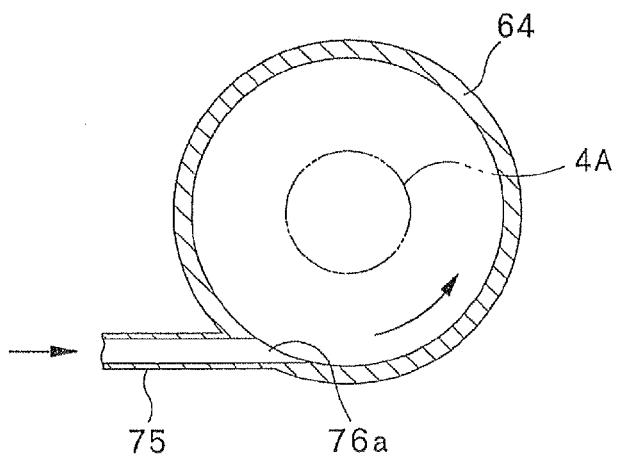
FIG. 7A, which corresponds to FIG. 6C, is a view for explaining a modification of a second solvent supply unit.

In this embodiment, the direction in which the first solvent supply passage 73 is connected toward the container 61 and the direction in which the second solvent supply passage 75 is connected toward the container 61 are the same. Namely, the first solvent from the first solvent supply passage 73 and the second solvent from the second solvent supply passage 75 inflow into the cleaning chamber 62 in the same direction. However, not limited thereto, as shown in FIG. 7A, the first solvent from the first solvent supply passage 73 and the second solvent from the second solvent supply passage 75 may be supplied into the cleaning chamber 62 in opposite directions. In this case, since the second solvent (thinner liquid) inflowing from the second solvent supply unit 72 into the cleaning chamber 62 forms a turning flow opposite to a turning flow of the first solvent (thinner liquid) inflowing from the first solvent supply unit 71 into the cleaning chamber 62, a flow velocity of the second solvent forming the turning flow in the cleaning chamber 62 is decelerated. Thus, a liquid pool of the second solvent can be easily formed in the cleaning chamber.

Figure 7B:
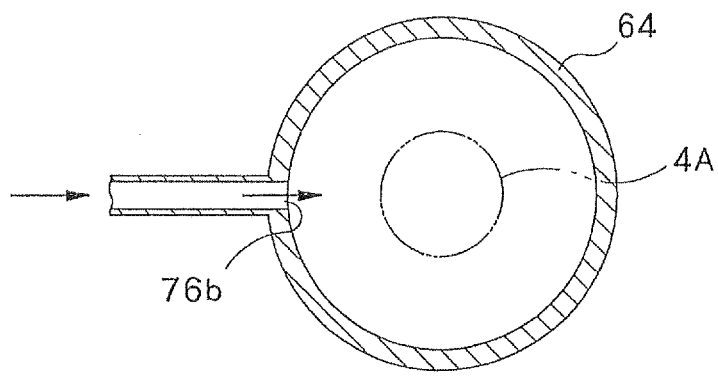
FIG. 7B, which corresponds to FIG. 6C, is a view for explaining another modification of the second solvent supply unit.

In addition, the position of the second inlet 76 is not limited to the above structure. For example, as shown in FIG. 7B, a second inlet 76b may be disposed so as to open toward the center of the cleaning chamber 62.

Figure 8:
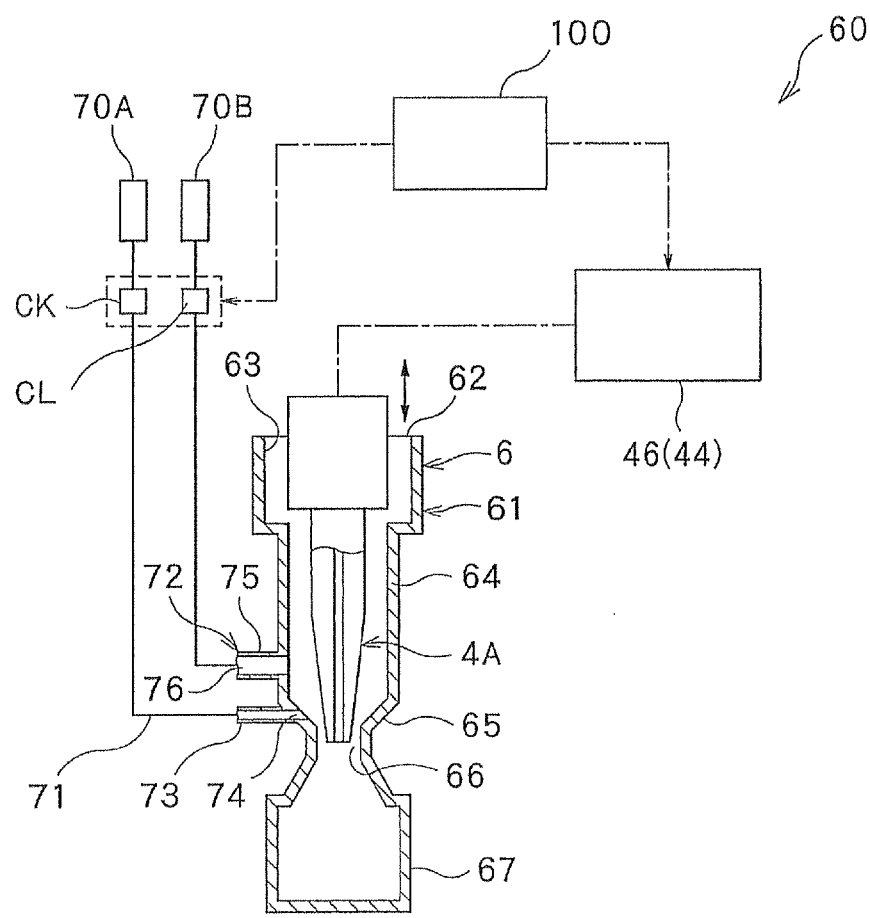
FIG. 8, which corresponds to FIG. 6A, is a view for explaining modifications of a first solvent supply unit and the second solvent supply unit.

In the above embodiment, the first solvent supply unit 71 and the second solvent supply unit 72 are connected to the same solvent supply source 70, and the first solvent supplied from the first solvent supply unit 71 and the second solvent supplied from the second solvent supply unit 72 are the same. However, not limited thereto, as shown in FIG. 8, a solvent supply source 70A for supplying a solvent to the first solvent supply unit 71 and a solvent supply source 70B for supplying a solvent to the second solvent supply unit 72 may be separately provided. In this case, a first solvent supplied (flown) from the solvent supply source 70A of the first solvent supply unit 71 and a second solvent supplied (flown) from the solvent supply source 70B of the second solvent supply unit 72 may be of different types. For example, while a first solvent beneficial to the cleaning of the nozzle may be, e.g., a thinner liquid, a second solvent beneficial to the prevention of drying of a resist liquid in the nozzle may be, e.g., cyclohexanone, propylene glycol methyl ether acetate (PGMEA), methyl amyl ketone (MAK), etc., which is a solvent having a volatility lower than that of the first solvent, i.e., a thinner. When a volatility of a solvent for preventing drying of a resist liquid is made lower than that of a solvent for cleaning (thinner liquid), volatilization of the solvent forming the solvent layer, which is enclosed in the distal end region in the nozzle 4A for preventing drying of a resist liquid, can be delayed, whereby drying of the resist liquid in the nozzle 4A can be restrained.

Figure 10:
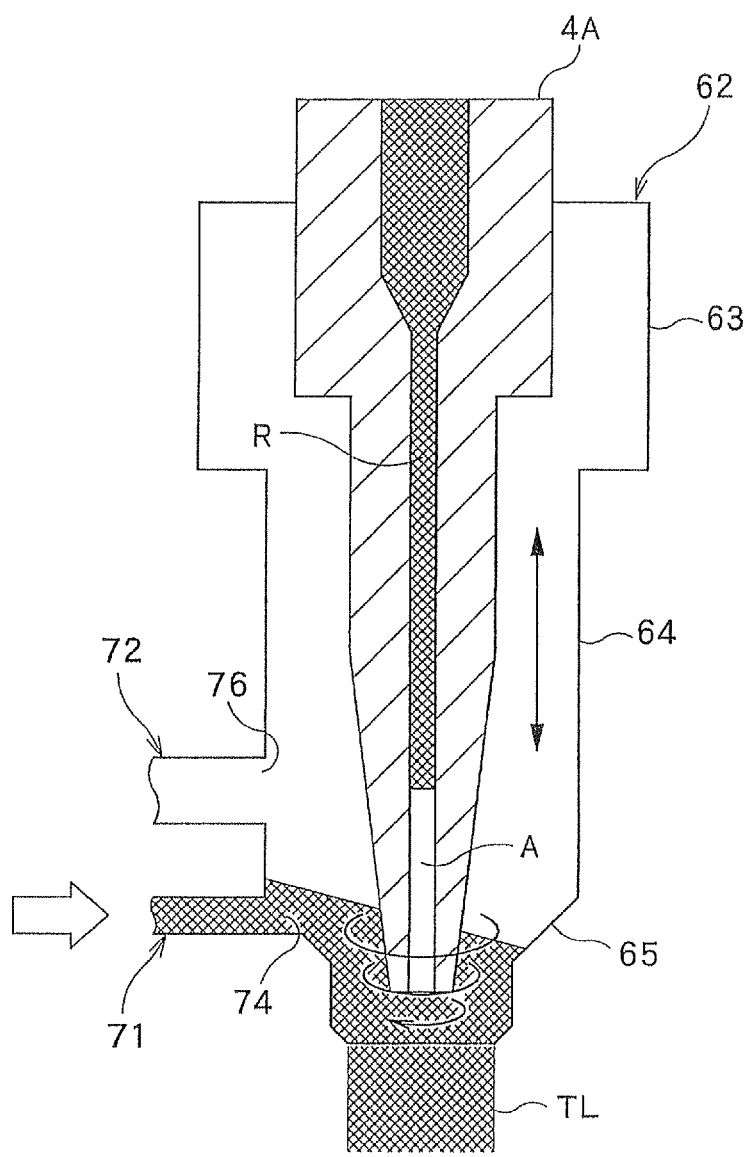
FIG. 10, which corresponds to FIG. 9(*c*), is a view for explaining a modification of the method of cleaning a nozzle.

In addition, as shown in FIG. 10, when the nozzle is being cleaned by a swirl flow of the solvent, the nozzles 4A to 4J may be moved upward and downward. By moving the nozzles 4A to 4J upward and downward, a contact portion between the outer circumferential surface of the nozzle to be cleaned and a swirl flow of the solvent can be varied, and the surface area to be cleaned can be increased. Therefore, the cleaning efficiency can be further improved.

Figure 5A:
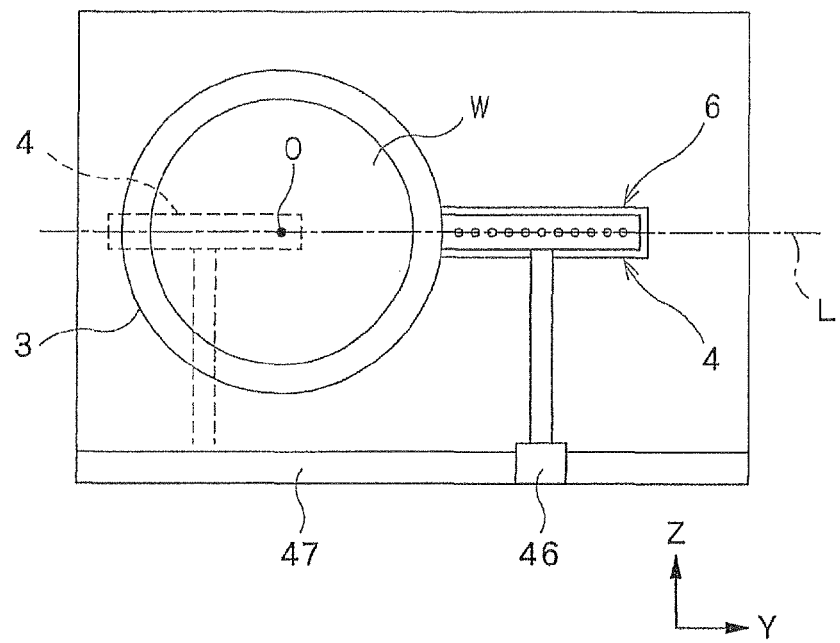
FIG. 5A is a schematic plan view showing a positional relationship among the nozzle unit, a standby unit, and a wafer.

As shown in FIG. 2, the nozzle unit 4 is supported such that the nozzle unit 4 can be elevated and lowered (moved in the Z-axis direction) by an elevation mechanism 44 along an elevation shaft 45 extending in the Z-axis direction. In addition, as shown in FIG. 5A, the nozzle unit 4 is supported by a horizontal movement mechanism 46 such that the nozzle unit 4 can be moved along a guide rail disposed along the length direction of the coating apparatus 2 (along the Y-axis direction). The nozzle unit 4 can be moved by the drive of the horizontal movement mechanism 46 along a straight line L passing the rotational center O of a wafer W. In this embodiment, a nozzle movement mechanism, which is configured to move the nozzle between a position at which the nozzle is received in the container 61 and a position at which the nozzle can discharge a process liquid onto a wafer W, is composed of the elevation mechanism 44 and the horizontal movement mechanism 46. In FIG. 2, the reference number 48 depicts the base plate.

Figure 5B:
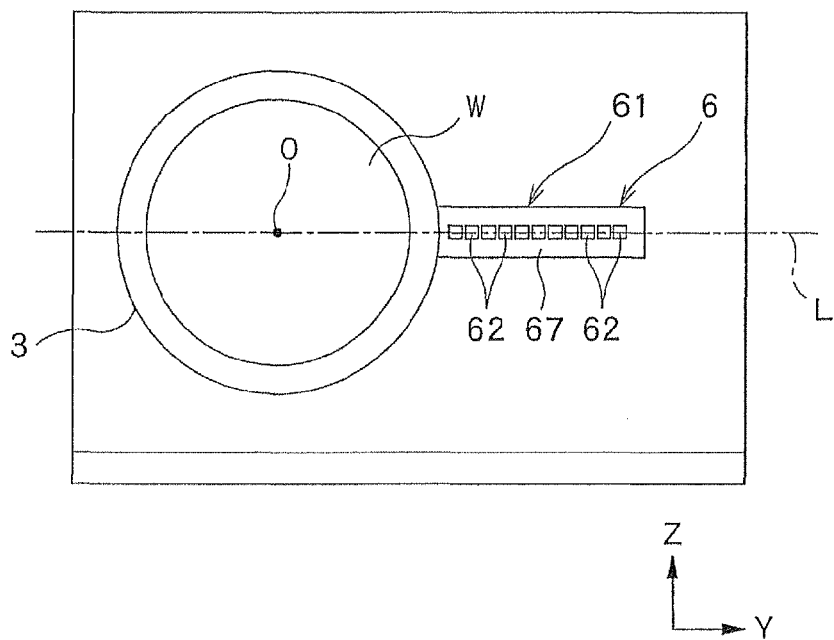
FIG. 5B is a schematic plan view showing a positional relationship between the standby unit and the wafer.

In this embodiment, as shown in FIG. 5A, for example, the process-liquid supply nozzles 4A to 4J and the solvent supply nozzle 5 of the nozzle unit 4 are arranged along the straight line L passing the rotational center O of the wafer W. Similarly, in this embodiment, as shown in FIG. 5B, for example, the respective cleaning chambers 62 of the standby unit 6 are arranged so as to position along the straight line L passing the rotational center O of the wafer W, and the liquid discharge chamber 67 of the standby unit 6 is located so as to extend along the straight line L passing the rotational center O of the wafer W. In FIGS. 5A and 5B, the nozzle unit 4 and the standby unit 6 are drawn largely relative to the wafer W for the convenience of illustration. In the nozzle unit 4, discharge holes formed in the distal end of the nozzle are drawn, although the holes are actually invisible to the naked eye.

The elevation mechanism 44 and the horizontal movement mechanism 46 have actuators formed of, e.g., motors. By the drive of the elevation mechanism 44 and the horizontal movement mechanism 46, the nozzle unit 4 can be elevated and lowered, and moved in the Y-axis direction. Thus, the nozzle unit 4 can be moved among: a standby position at which the distal end of each of the process-liquid supply nozzles 4A to 4J of the nozzle unit 4 is located slightly above the upper surface of the container 61 of the standby unit 6 by, e.g., between about 1 mm and 2 mm; a position at which the distal end of each of the process-liquid supply nozzles 4A to 4J are received in the cleaning chamber 62; and a position at which one of the process-liquid supply nozzles 4A to 4J and the solvent supply nozzle 5 can supply a process liquid or a solvent to the rotational center O of a wafer W. In addition, the nozzle unit 4 can be moved upward and downward in the cleaning chamber 62.

The suck back valves VA to VJ, the flow-rate adjusting parts CA to CJ of the nozzle unit 4, the flow-rate adjusting parts CK and CL of the standby unit 6, the elevation mechanism 44 and the horizontal movement mechanism 46 are controlled by the controller 100 as a control apparatus. For example, based on a control signal from the controller 100, only one process-liquid supply nozzle 4A (4B to 4J) is sucked and all the process-liquid supply nozzles 4A to 4J are sucked at preset timings. Amounts of a resist liquid and a solvent to be sucked back, amounts of a solvent and a resist liquid to be discharged from the process-liquid supply nozzles 4A (4B to 4J), control amounts of the suck back valves VA to VJ and the flow-rate adjusting parts CA to CJ, CK, and CL, and a control amount of the flow-rate adjusting part of the standby unit 6, are determined based on a process program previously stored in the controller 100.

Figure 9:
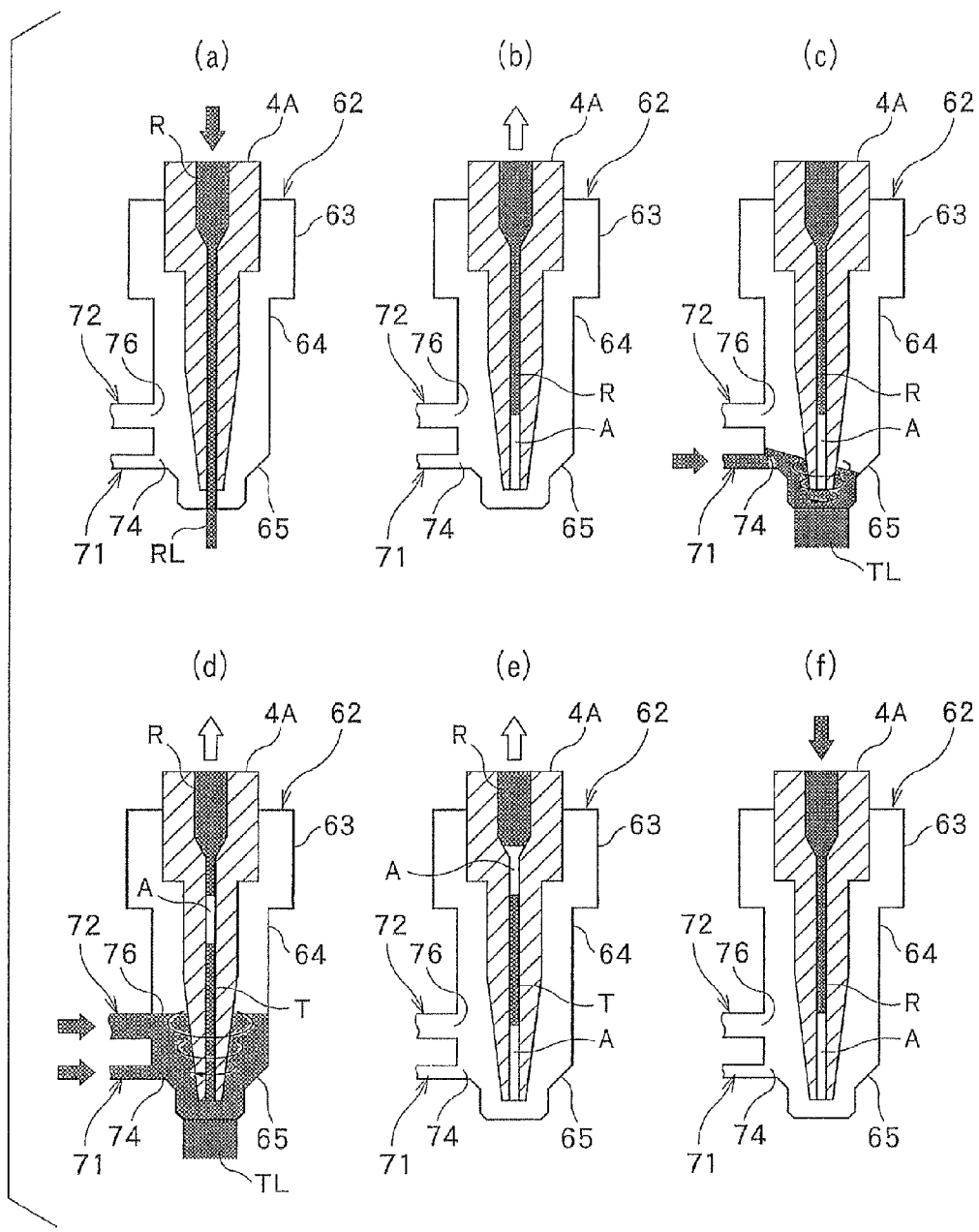
FIG. 9 is a longitudinal sectional view showing the cleaning and drying-preventing apparatus, for explaining a method of cleaning a nozzle and a method of preventing drying of a process liquid in the nozzle, which are performed by the cleaning and drying-preventing apparatus.

Next, an operation performed by the coating apparatus 2 is described with reference mainly to FIG. 9. In FIG. 9, the process-liquid supply nozzle 4A is shown as a representative of the process-liquid supply nozzles 4A to 4J. After a coating process in a liquid process for a substrate has been performed, the nozzle unit 4 is moved to a position opposed to the standby unit 6, and the distal ends of the process-liquid supply nozzles 4A to 4J are respectively received in the corresponding cleaning chambers 62. Under this state, a resist liquid RL in the distal end regions in the process-liquid supply nozzles 4A to 4J is discharged into the cleaning chambers 62 by a dummy dispensing (see, FIG. 9(a)). Then, a first sucking action for the respective process-liquid supply nozzles 4A to 4J is performed by the respective suck back valves VA to VJ disposed on the respective process-liquid supply passages 42A to 42J (see, FIG. 9(b)). By this sucking action, as shown in FIG. 9(b), a liquid level of a process liquid 71 in each of the process-liquid supply nozzles 4A to 4J is retracted from the position before the sucking action to the side of the process-liquid supply passage 42A, whereby the liquid level is raised from the distal end of the nozzle 4A. At this time, it is preferable that the sucking action by the suck back valve VA raises the liquid level of the process liquid in the nozzle 4A by between about 1 mm and 3 mm from the distal end of the nozzle. Since the resist liquid RL in the distal end region in the nozzle 4A has been discharged by a dummy dispensing, the resist liquid remaining in the distal end region in the nozzle can be discharged and droplets of the resist liquid can be prevented from being sucked into the distal end of the nozzle.

Then, by supplying a predetermined amount of a solvent such as a thinner liquid TL from the first solvent supply unit 71 into the cleaning chamber 62, a swirl flow of the thinner liquid TL turning around the distal end of the nozzle 4A is formed. The distal end of the nozzle 4A is cleaned by the swirl flow (see, FIG. 9(c)). Then, by supplying a predetermined amount of a solvent such as a thinner liquid TL from the second solvent supply unit 72 into the cleaning chamber 62, a liquid pool of the thinner liquid TL is formed in the cleaning chamber 62 (see, FIG. 9(d)). Under the state in which the liquid pool of the thinner liquid TL is formed around the distal end of the nozzle in the cleaning chamber 62, the liquid in the nozzle 4A is sucked by the suck back valve VA, so that the liquid level of the process liquid in the nozzle 4A is further retracted to the side of the process-liquid supply passage 42A, and that the thinner liquid is flown into nozzle 4A from the distal end of the nozzle 4A. Thus, in the distal end region in the nozzle 4A, there are arranged a resist liquid layer R (process liquid layer), an air layer A, and a thinner liquid layer T (solvent for process liquid layer), in this order from the side of the process-liquid supply passage 42A (see, FIG. 9(d)). It is preferable that the sucking action by the suck back valve VA raises the liquid level of the thinner liquid TL in the nozzle 4A by between about 5 mm and 15 mm from the distal end of the nozzle. Thereafter, under the state in which the supply of the solvent such as a thinner liquid from the first solvent supply unit 71 and the second solvent supply unit 72 is stopped, i.e., under the state in which the liquid pool of the thinner liquid TL is not formed around the distal end of the nozzle in the cleaning chamber 62, the liquids in the nozzle 4A are sucked by the suck back valve VA so that another air layer A is formed in the nozzle 4A on a most distal end side of the nozzle path (see, FIG. 9(e)). The formation of the air layer A on a distal end side of the thinner liquid layer T (solvent for process liquid layer) is preferred in that droplets of the thinner liquid can be prevented from being sucked into the distal end region in the nozzle 4A. Under this state, the respective process-liquid supply nozzles 4A to 4J of the nozzle unit 4 wait in the standby unit 6.

Next, there is described, in the liquid coating apparatus 2, a method for performing a liquid process (coating process) for coating a process liquid to a wafer W with the use of the nozzle unit 4 in which the resist liquid layer R (process liquid layer), the air layer A, and the thinner liquid layer T (solvent for process liquid layer) are formed on the distal end of each of the process-liquid supply nozzles 4A to 4J. Herebelow, a coating process performed by using the nozzle 4A among the nozzles 4A to 4J included in the nozzle unit 4 is described by way of example.

At first, there is performed a process in which the thinner liquid layer T (solvent for process liquid layer) is discharged from the process-liquid supply nozzle 4A. Namely, as shown in FIG. 9(f), the nozzle unit 4 is moved so as to position the process-liquid supply nozzle 4A in the cleaning chamber 62 of the standby unit 6, and a predetermined amount of the resist liquid is discharged by the flow-rate adjusting part CA. Then, the resist liquid is sucked back. In order to restrain a waste amount of the resist liquid, a supply amount of the resist liquid for discharging only the thinner liquid layer T is preferably determined by an experiment in advance. By lowering the liquid level of the resist liquid by, e.g., about 2 mm, the thinner liquid layer T is discharged. A control amount of the flow-rate adjusting part CA is previously stored in the controller 100.

Then, the nozzle unit 4 is arranged in position such that the process-liquid supply nozzle 4A is located on a coating position at which the nozzle 4A can supply a coating liquid to a wafer W, and a coating process is performed by supplying a resist liquid from the process-liquid supply nozzle 4A to the wafer W. Prior to this process, loading of the wafer W and coating of a solvent to the wafer W are performed as described below.

The loading of a wafer W is performed by the elevation pin and the main transfer means, which are not shown. Specifically, under the state that the spin chuck 21 is positioned above the cup 3, a wafer W, which has been transferred from a prior process by the main transfer means, is received on the elevation pin by elevating the elevation pin. Thereafter, the main transfer means is retracted and then the elevation pin is lowered. Thus, the wafer W on the elevation pin is placed on the spin chuck 21. After that, the spin chuck 21 holding the wafer W is lowered to a process position.

Then, the nozzle unit 4 is arranged in position such that the solvent supply nozzle 5 is located on a position at which the solvent supply nozzle 5 can supply a solvent to the rotational center O of the wafer W held by the spin chuck 21, and a thinner liquid as a solvent is supplied from the solvent supply nozzle 5 to the wafer W. Then, the wafer W is rotated by the spin chuck 21, so that the thinner liquid on the wafer W is diffused from the center O of the wafer W to the peripheral part of the wafer W due to the centrifugal force of the rotation.

Then, the rotation of the spin chuck 21 is stopped. Thereafter, the nozzle unit 4 is arranged in position such that the process-liquid supply nozzle 4A is located on a position at which the nozzle 4A can supply a resist liquid to the rotational center O of the wafer W held by the spin chuck 21, and a resist liquid as a process liquid is supplied from the process-liquid supply nozzle 4A to the wafer W. Then, the wafer W is rotated by the spin chuck 21, so that the resist liquid on the wafer W is diffused from the center O of the wafer W to the peripheral part of the wafer W due to the centrifugal force of the rotation. The resist liquid is supplied to the wafer W, under the state in which the surface of the wafer W is wetted by the thinner liquid, for example. The wafer W coated with the resist liquid in this manner is transferred to the main transfer means via the elevation pin from the spin chuck 21, which has been moved above the cup 3.

After the finish of the coating process, in a case where discharge of a coating liquid is not performed for a predetermined period of time or more, the process-liquid supply nozzle 4A used in the coating process is received in the cleaning chamber 62 of the standby unit 6, and the process of cleaning the nozzle 4A and the process of preventing drying of the resist liquid in the nozzle 4A are performed in the above described manner. To be specific, the resist liquid in the distal end region in the process-liquid supply nozzle 4A is discharged by a dummy dispensing (see, FIG. 9(*a*)). Then, by a sucking action by the suck back valve VA, an air layer A is formed on a most distal end side in the nozzle 4A (see, FIG. 9(*b*)). Thereafter, a thinner liquid TL is supplied from the first solvent supply unit 71 into the cleaning chamber 62, so that the distal end of the nozzle 4A is cleaned by a swirl flow of the thinner liquid (see, FIG. 9(*c*)). Then, a solvent such as a thinner liquid TL is supplied from the second solvent supply unit 72 into the cleaning chamber 62, so that a liquid pool of the thinner liquid is formed in a region surrounding the distal end of the nozzle 4A (see, FIG. 9(*d*)). After that, owing to a sucking action by using the suck back valve VA, the thinner forming the liquid pool in the distal end region in the nozzle 4A is sucked. Thus, in the distal end region in the nozzle 4A, there are formed a resist liquid layer R (process liquid layer), the air layer A, and a thinner liquid layer T (solvent for process liquid layer) are formed in this order from the side of the process-liquid supply passage 42A (see, FIG. 9(*d*)).

Following thereto, the aforementioned coating process may be performed by using the other process-liquid supply nozzle 4B that is different from the process-liquid supply nozzle 4A. Specifically, similarly to the case of the process-liquid supply nozzle 4A, the thinner liquid layer T is discharged from the other process-liquid supply nozzle 4B. Then, a resist liquid as a process liquid is supplied to the wafer W by means of the process-liquid supply nozzle 4B. Thereafter, the nozzle unit 4 (process-liquid supply nozzles 4B to 4J) is moved to a position above the standby unit 6. The process-liquid supply nozzles 4B to 4J are respectively received in the cleaning chambers 62, and a thinner liquid TL is supplied from the first solvent supply unit 71 into the cleaning chamber 62 so that the distal end of the nozzle 4B is cleaned. Then, there is performed a process in which a resist liquid layer R, an air layer A, and a thinner liquid layer T are formed in the distal end region in the process-liquid supply nozzle 4B. At this time, it is generally preferable that the nozzle unit 4 waits in the air. For example, the nozzle unit 4 waits on a waiting position at which the distal ends of the respective process-liquid supply nozzles 4A to 4J of the nozzle unit 4 are located slightly above the upper surfaces of the containers 61 of the standby unit 6 by, e.g., between about 1.5 mm and 2 mm.

The above-described series of operations relating to the process-liquid supply nozzle 4A, specifically, the series of operations such as the discharge of the solvent from the process-liquid supply nozzle 4A, the coating process with the use of the process-liquid supply nozzle 4A, the first sucking action of the liquid in the process-liquid supply nozzle 4A by the suction mechanism, the cleaning of the distal end of the process-liquid supply nozzle 4A, and the second sucking action of the liquids in the process-liquid supply nozzles 4A by the suction mechanism, and the succeeding series of operations relating to the process-liquid supply nozzle 4B, are performed based on the process program stored in the controller 100.

According to the above cleaning and drying-preventing method, since an air layer A and a thinner liquid layer T are formed on a side distal relative to (outside) a resist liquid layer R in each of the process-liquid supply nozzles 4A to 4J, the resist liquid layer R in each of the process-liquid supply nozzles 4A to 4J can be prevented from contacting an atmospheric air. The air layer A, which is formed between the resist liquid layer R and the thinner liquid layer T, becomes saturated by the volatilization of a solvent. Thus, drying of the process liquid forming the resist liquid layer R, which might be caused by the contact between the resist liquid layer R and the air layer A, can be restrained. For these reasons, drying of the resist liquid in the process-liquid supply nozzles 4A to 4J can be effectively restrained. In addition, owing to the air layer A formed between the resist liquid layer R and the thinner liquid layer T, the resist liquid layer R and the thinner liquid layer T are not brought into contact with each other, whereby the solvent of the thinner liquid layer T can be prevented from being mixed into the process liquid.

As described above, in this embodiment, the respective process-liquid supply nozzles 4A to 4J are received in the cleaning chambers 62, and the distal ends thereof are cleaned. In addition, by forming an air layer A and a thinner liquid layer T outside a resist liquid layer R in the respective process-liquid supply nozzles 4A to 4J, drying of the process liquid forming the resist liquid layer R can be prevented. Thus, even in an integral-type nozzle equipped with a plurality of nozzles, there is no possibility that a process liquid in a nozzle not in use is exposed to the air, whereby drying of the process liquid can be more reliably restrained. In addition, as compared with the case in which a member (means) for preventing drying is provided on the nozzle unit 4 having a plurality of nozzles, enlargement in size of the nozzle unit 4 can be restrained. Even when the number of process-liquid supply nozzles that are integrally disposed on the nozzle unit 4 is increased, a size of the nozzle unit 4 is enlarged only in accordance with the increased number of nozzles.

In addition, since drying of a process liquid in the process-liquid supply nozzles 4A to 4J can be restrained, it is not necessary to discharge, before a coating process, a process liquid which may be dried and degraded, or it is not necessary to periodically discharge such a process liquid. Thus, since the wasteful use of an expensive process liquid can be restrained, the present invention is effective in terms of cost.

Further, all the process-liquid supply nozzles 4A to 4J can be simultaneously, collectively subjected to the aforementioned process for cleaning the nozzles and the process for preventing drying of a process liquid in the nozzles in an effective and easy manner.

Furthermore, the process-liquid supply nozzles 4A to 4J and the solvent supply nozzle 5 of the nozzle unit 4 are arranged along the straight line L passing the rotational center O of a wafer W, and the cleaning chambers 62 and the liquid discharge chamber 67 are disposed along the straight line L passing the rotational center O. Thus, by moving horizontally the process-liquid supply nozzles 4A to 4J in one direction (in Y direction), and by elevating and lowering the nozzles 4A to 4J, the nozzle unit 4 can be moved among: a position at which a process liquid is supplied to a wafer W from the process-liquid supply nozzles 4A to 4J, a position at which a thinner liquid is discharged from the process-liquid supply nozzles 4A to 4J to the liquid discharge chamber 67, and a position at which the process-liquid supply nozzles 4A to 4J are received in the cleaning chambers 62 so that a solvent can be sucked into the nozzles. That is to say, the nozzle unit 4 can be moved in a required direction without using a driving mechanism for moving the nozzle unit 4 in a horizontal direction (e.g., X direction) other than the one direction. Thus, the means for moving the nozzle unit 4 can be simplified.

Figure 11:
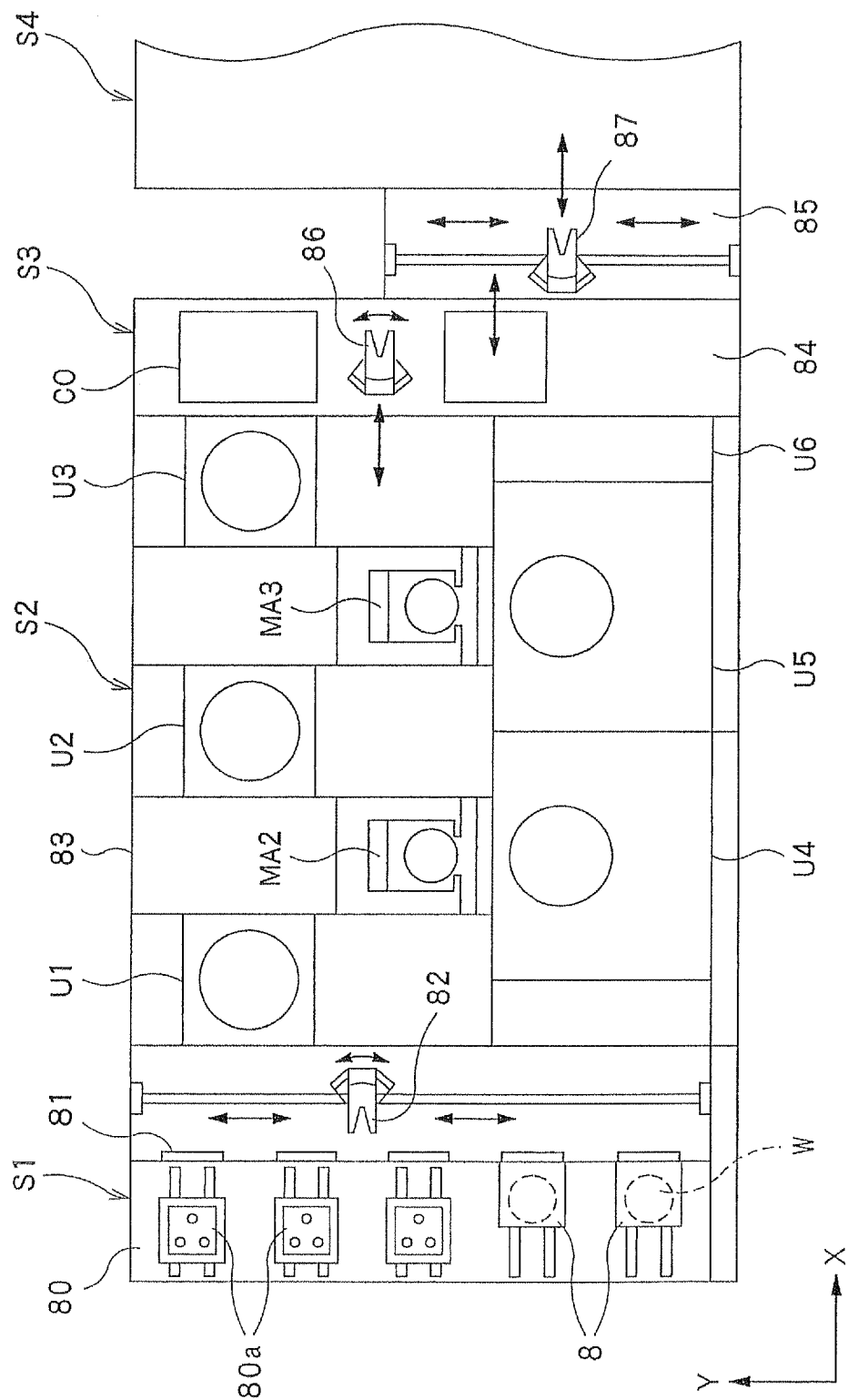
FIG. 11 is a plan view showing an example of a coating and developing process system in which the coating apparatus shown in FIG. 2 is incorporated.

Next, the overall structure of a coating and developing process system for forming a resist pattern, in which an exposure part (exposure apparatus) is connected to a coating and developing apparatus incorporating the coating apparatus 2, is described with reference to FIGS. 11 and 12. In the drawings, the reference number S1 depicts a carrier placement section through which a carrier 8 in which thirteen wafers are hermetically accommodated can be loaded into and unloaded from the system. The carrier placement section S1 includes: a carrier station 80 having a placement part 80a on which a plurality of carriers 8 can be placed in a line; an opening and closing part 81 formed in a front wall surface when viewed from the carrier station 80; and a transfer means 82 for taking out a wafer W from carriers 8 through the opening and closing part 81.

The rear side of the carrier placement section S1 is connected to a processing section S2 whose periphery is surrounded by a housing 83. In the processing section S2, there are disposed liquid processing units U4 and U5, and shelf units U1, U2, and U3 in which heating and cooling units are disposed at multiple stages. The shelf units U1, U2, and U3 having the multiple stages are aligned in one direction from the side of the carrier placement section S1. Main transfer means MA1 and MA2 configured to transfer a wafer W among the respective units of the shelf units U1 to U3 and the liquid processing units U4 and U5 are located between the shelf units U1 and U2 and between the shelf units U2 and U3 at positions where the main transfer means MA1 and MA2 are accessible to one of the liquid processing units U4 and U5. Namely, the shelf units U1, U2, and U3, and the main transfer means MA1 and MA2 are aligned when viewed from the side of the carrier placement section S1. Openings through which a wafer can be transferred are formed in respective connection parts therebetween. A wafer W can be freely moved in the processing section S2 from the shelf unit U1 on one end of the processing section S2 to the shelf unit U3 on the other end of the processing section S2.

The shelf units U1, U2, and U3 include various units for performing preprocesses and postprocesses of processes performed in the liquid processing units U4 and U5. The shelf units U1, U2, and U3 are structured by stacking the various units at a plurality of stages, e.g., ten stages. To be specific, the shelf units U1, U2, and U3 include a transfer unit, a hydrophobing unit (ADH), a temperature adjusting unit (CPL) for adjusting a temperature of a wafer W to a predetermined one, a heating unit (BAKE) for heating a wafer W before a resist-liquid coating process, a heating unit (PAB) called prebaking unit for heating a wafer W after a resist-liquid coating process, a heating unit (POST) called postbaking unit for heating a wafer W after a developing process, and so on.

Figure 12:
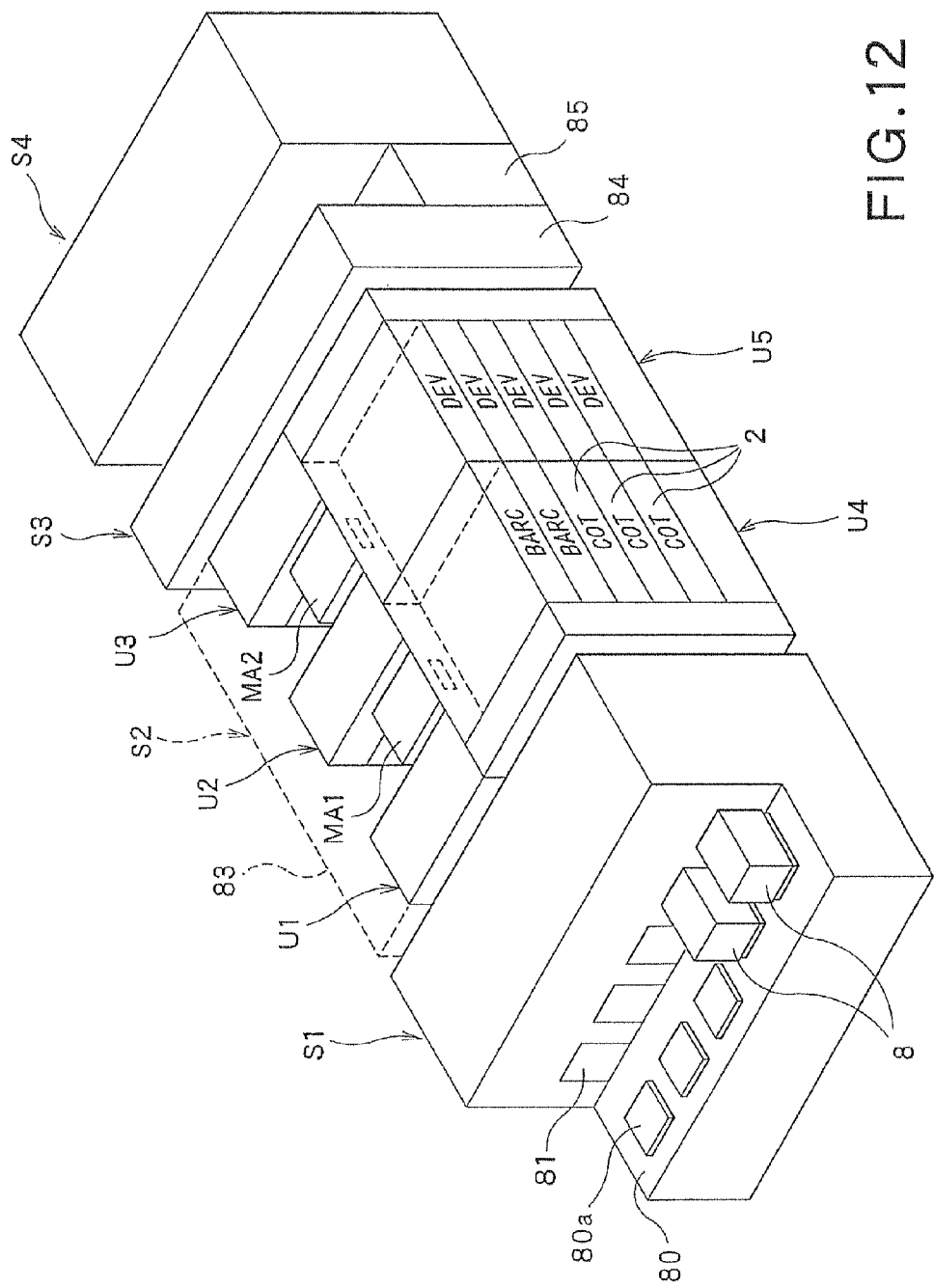
FIG. 12 is a schematic perspective view of the coating and developing process system shown in FIG. 11.

In addition, as shown in FIG. 12, for example, the liquid processing units U4 and U5 are structured by stacking an anti-reflection film coating unit (BARC), the above-described coating apparatus (COT) 2, a developing unit (DEV) for developing a wafer W by supplying thereto a developer, and so on, at a plurality of stages, e.g., five stages.

An exposure section S4 is connected via an interface section S3 to a rear side of the shelf unit U3 in the processing section S2. The interface section S3 includes a first transfer chamber 84 and a second transfer chamber 85 which are arranged side by side between the processing section S2 and the exposure section S4. In the first transfer chamber 84 and the second transfer chamber 85, respectively, there are provided a first transfer arm 86 and a second transfer arm 87 which can be elevated and lowered, rotated about a vertical axis, and moved forward and rearward.

In the first transfer chamber 84, there is disposed a shelf unit U6 that is structured by vertically stacking, for example, a transfer unit, a high-precision temperature adjusting unit (CPL), a heating and cooling unit (PEB) for performing a post exposure baking process of a wafer W, and so on.

An example of a flow of a wafer W in the resist-pattern forming system as structured above is described. A wafer W accommodated in the carrier 8 placed in the carrier placement section S1 is transferred to the temperature adjusting unit (CPL), the anti-reflection film forming unit (BARC), the heating unit (BAKE), the temperature adjusting unit (CPL), the coating apparatus (COT) 2, the heating unit (PAB), and the exposure section S4 in this order, and the wafer W is subjected to an exposure process in the exposure section S4. The exposed wafer W is transferred to the heating unit (PEB), the high-precision temperature adjusting unit (CPL), the developing unit (DEV), the heating unit (POST), the temperature adjusting unit (CPL), and the carrier 8 placed in the carrier placement section S1 in this order.

In the above embodiment, the cleaning and drying-preventing apparatus 60 of the present invention is applied to the coating and developing process system for a semiconductor wafer. However, not limited thereto, the cleaning and drying-preventing apparatus 60 can be applied to a coating and developing process system for a substrate to be processed other than a semiconductor wafer, such as an FPD (flat panel display) substrate.

What is claimed:

1. A cleaning method for cleaning a process-liquid supply nozzle configured to supply a process liquid to a substrate so as to process the substrate, the cleaning method comprising:
receiving the nozzle in a container having a funnel-like inner circumferential surface and defining therein a cleaning chamber, such that the inner circumferential surface is located around a distal end of the nozzle and that a lower end of the funnel-like inner circumferential surface is located above the distal end of the nozzle;

sucking the process liquid remaining in the nozzle so as to retract a liquid level of the process liquid in the nozzle to a side of a process-liquid supply passage;

supplying a first solvent for the process liquid from a first solvent supply unit into the cleaning chamber along the funnel-like inner circumferential surface in a circumferential direction of the inner circumferential surface so as to form a swirl flow of the first solvent turning around the distal end of the nozzle, and cleaning the nozzle by the swirl flow; and supplying a second solvent for the process liquid from a second solvent supply unit to a region positioned above the funnel-like inner circumferential surface in the cleaning chamber so as to form a liquid pool of a solvent in the cleaning chamber, and sucking a portion of the solvent in the liquid pool into the nozzle.

2. The cleaning method according to claim 1, wherein the second solvent is supplied from the second solvent supply unit into the cleaning chamber along an inner circumferential surface of the container in a circumferential direction of the inner circumferential surface; and the circumferential direction in which the first solvent is supplied from the first solvent supply unit and the circumferential direction in which the second solvent is supplied from the second solvent supply unit are opposite to each other.

3. The cleaning method according to claim 1, wherein a volatility of the second solvent supplied from the second solvent supply unit is lower than a volatility of the first solvent supplied from the first solvent supply unit.

4. The cleaning method according to claim 1, wherein the nozzle is moved upward and downward, while the nozzle is being cleaned by the swirl flow of the first solvent.

5. The cleaning method according to claim 1, wherein the second solvent is supplied from the second solvent supply unit into the cleaning chamber along an inner circumferential surface of the container in a circumferential direction of the inner circumferential surface; and the circumferential direction in which the first solvent is supplied from the first solvent supply unit and the circumferential direction in which the second solvent is supplied from the second solvent supply unit are opposite to each other.

6. The cleaning method according to claim 1, wherein a volatility of the second solvent supplied from the second solvent supply unit is lower than a volatility of the first solvent supplied from the first solvent supply unit.

7. The cleaning method according to claim 1, wherein the nozzle is moved upward and downward, while the nozzle is being cleaned by the swirl flow of the first solvent.

8. A cleaning apparatus for cleaning a process-liquid supply nozzle configured to supply a process liquid to a substrate so as to process the substrate, the cleaning apparatus comprising:

a container configured to be capable of receiving the nozzle, the container having a funnel-like inner circumferential surface to be located around a distal end of the received nozzle and a lower end of the funnel-like inner circumferential surface located above the distal end of the nozzle, and defining therein a cleaning chamber;

a first solvent supply unit connected to the container, the first solvent supply unit being configured to supply a first solvent for the process liquid into the cleaning chamber along the funnel-like inner circumferential surface in a circumferential direction of the inner circumferential surface;

a second solvent supply unit connected to the container, the second solvent supply unit being configured to supply a second solvent for the process liquid to a region positioned above the funnel-like inner circumferential surface in the cleaning chamber;

a suction mechanism configured to suck a liquid in the nozzle to a side of a process liquid supply passage communicated with the nozzle so as to supply the process liquid to the nozzle;

a nozzle movement mechanism configured to move the nozzle between a position inside the container and a position at which a process liquid is discharged to the substrate; and a control device configured to control the first solvent supply unit, the second solvent supply unit, the suction mechanism, and the nozzle movement mechanism;

wherein the control device is configured to control the first solvent supply unit, the second solvent supply unit, the suction mechanism, and the nozzle movement mechanism such that;

the first solvent is supplied from the first solvent supply unit into the cleaning chamber so as to form a swirl flow of the first solvent turning around the distal end of the nozzle, so that the nozzle is cleaned by the swirl flow; and then, the second solvent is supplied from the second solvent supply unit into the cleaning chamber so as to form a liquid pool of a solvent in the cleaning chamber and a portion of the solvent from the liquid pool is sucked into the nozzle.

9. The cleaning apparatus according to claim 8, wherein the first solvent supply unit includes a first solvent supply passage extended so as to be tangent to the funnel-like inner circumferential surface and communicated with the container, the second solvent supply unit includes a second solvent supply passage extended so as to be tangent to an inner circumferential surface of the container, which is positioned above the funnel-like inner circumferential surface, and communicated with the container, and the first solvent from the first solvent supply passage and the second solvent from the second solvent supply passage are discharged into the cleaning chamber in directions opposite to each other.

10. The cleaning apparatus according to claim 8, wherein a volatility of the second solvent supplied from the second solvent supply unit is lower than a volatility of the first solvent supplied from the first solvent supply unit.

11. The cleaning apparatus according to claim 8, wherein the control device is configured to move the nozzle upward and downward by the nozzle movement mechanism, while the nozzle is being cleaned by the swirl flow of the first solvent.

12. The cleaning apparatus according to claim 8, wherein the first solvent supply unit includes a first solvent supply passage extended so as to be tangent to the funnel-like inner circumferential surface and communicated with the container, the second solvent supply unit includes a second solvent supply passage extended so as to be tangent to an inner circumferential surface of the container, which is positioned above the funnel-like inner circumferential surface, and communicated with the container, and the first solvent from the first solvent supply passage and the second solvent from the second solvent supply passage are discharged into the cleaning chamber in directions opposite to each other.

13. The cleaning apparatus according to claim 8, wherein a volatility of the second solvent supplied from the second solvent supply unit is lower than a volatility of the first solvent supplied from the first solvent supply unit.

14. The cleaning apparatus according to claim 8, wherein the control device is configured to move the nozzle upward and downward by the nozzle movement mechanism, while the nozzle is being cleaned by the swirl flow of the first solvent.

15. A non-transitory storage medium storing a program executed by a control device for controlling a cleaning apparatus, wherein, upon execution by the control device, the program causes the cleaning apparatus to perform the cleaning method according to claim 1.

* * * * *